United States Patent
Kuraguchi et al.

(10) Patent No.: US 10,910,490 B2
(45) Date of Patent: Feb. 2, 2021

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Masahiko Kuraguchi, Yokohama (JP); Yosuke Kajiwara, Yokohama (JP); Aya Shindome, Yokohama (JP); Hiroshi Ono, Setagaya (JP); Daimotsu Kato, Kawasaki (JP); Akira Mukai, Kawasaki (JP); Toshiki Hikosaka, Kawasaki (JP); Jumpei Tajima, Mitaka (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/565,779

(22) Filed: Sep. 10, 2019

(65) Prior Publication Data

US 2020/0220003 A1 Jul. 9, 2020

(30) Foreign Application Priority Data

Jan. 8, 2019 (JP) ................. 2019-001100

(51) Int. Cl.
*H01L 29/00* (2006.01)
*H01L 29/778* (2006.01)
(Continued)

(52) U.S. Cl.
CPC .......... *H01L 29/7786* (2013.01); *H01L 29/04* (2013.01); *H01L 29/2003* (2013.01);
(Continued)

(58) Field of Classification Search
CPC ............ H01L 29/2003; H01L 29/7786; H01L 29/0657
See application file for complete search history.

(56) References Cited

U.S. PATENT DOCUMENTS 9,419,119 B2 * 8/2016 Takada .............. H01L 21/28008
9,741,838 B2 * 8/2017 Nishikawa .......... H01L 29/0696
(Continued)

FOREIGN PATENT DOCUMENTS

| JP | 2007-67240 A | 3/2007 |
| JP | 2008-270794 A | 11/2008 |

(Continued)

*Primary Examiner* — Nicholas J Tobergte
(74) *Attorney, Agent, or Firm* — Oblon, McClelland, Maier & Neustadt, L.L.P.

(57) ABSTRACT

According to one embodiment, a semiconductor device includes first to third electrodes, first to fourth semiconductor regions, a first layer including, and a first insulating layer. The first semiconductor region includes $Al_{x1}Ga_{1-x1}N$ and includes first to fifth partial regions. The third partial region includes a first element including at least one selected from the group consisting of Mg, Zn, and C. The second semiconductor region includes $Al_{x2}Ga_{1-x2}N$ and includes a sixth partial region and a seventh partial region. The third semiconductor region includes $Al_{x3}Ga_{1-x3}N$ and includes an eighth partial region and a ninth partial region. The fourth semiconductor region includes $Al_{x4}Ga_{1-x4}N$ and includes a tenth partial region and an eleventh partial region. The first layer includes $Al_yGa_{1-y}N$ and includes a first portion provided between the third partial region and the third electrode. The first insulating layer includes a second portion provided between the first portion and the third electrode.

20 Claims, 7 Drawing Sheets

(51) Int. Cl.
  *H01L 29/20* (2006.01)
  *H01L 29/66* (2006.01)
  *H01L 29/207* (2006.01)
  *H01L 29/04* (2006.01)
  *H01L 29/423* (2006.01)
  *H01L 29/06* (2006.01)

(52) U.S. Cl.
  CPC ........ H01L 29/207 (2013.01); H01L 29/4236 (2013.01); H01L 29/66462 (2013.01); *H01L 29/0657* (2013.01); *H01L 29/2006* (2013.01)

(56) References Cited

U.S. PATENT DOCUMENTS

| | | | |
|---|---|---|---|
| 9,837,488 B2* | 12/2017 | Saito | H01L 29/0847 |
| 10,236,341 B2* | 3/2019 | Ohashi | H01L 29/063 |
| 10,249,717 B2* | 4/2019 | Ariyoshi | H01L 29/7802 |
| 10,381,441 B2* | 8/2019 | Kyogoku | H01L 29/66348 |
| 10,431,649 B2* | 10/2019 | Kyogoku | H01L 29/0623 |
| 10,573,735 B2* | 2/2020 | Koyama | H01L 29/7783 |
| 10,651,161 B2* | 5/2020 | Koyama | H01L 25/16 |
| 2007/0045670 A1 | 3/2007 | Kuraguchi | |
| 2008/0105954 A1* | 5/2008 | Kodama | H01L 29/0634 257/623 |
| 2008/0237605 A1 | 10/2008 | Murata et al. | |
| 2015/0060943 A1* | 3/2015 | Motonobu | H01L 29/205 257/192 |
| 2015/0236103 A1 | 8/2015 | Kuraguchi | |
| 2017/0077277 A1 | 3/2017 | Saito et al. | |
| 2017/0301765 A1 | 10/2017 | Tsuchiya et al. | |
| 2018/0219070 A1* | 8/2018 | Ariyoshi | H01L 29/41766 |
| 2019/0131398 A1* | 5/2019 | Kyogoku | H01L 29/402 |
| 2019/0164943 A1* | 5/2019 | Koyama | H01L 25/16 |
| 2019/0189736 A1* | 6/2019 | Kyogoku | H01L 29/1608 |

FOREIGN PATENT DOCUMENTS

| | | |
|---|---|---|
| JP | 2009-170546 A | 7/2009 |
| JP | 2016-72358 A | 5/2016 |
| JP | 2017-59599 A | 3/2017 |
| JP | 2017-73525 A | 4/2017 |

* cited by examiner

SEMICONDUCTOR DEVICE

CROSS-REFERENCE TO RELATED APPLICATIONS

This application is based upon and claims the benefit of priority from Japanese Patent Application No. 2019-001100, filed on Jan. 8, 2019; the entire contents of which are incorporated herein by reference.

FIELD

Embodiments described herein relate generally to a semiconductor device.

BACKGROUND

It is desirable to reduce the on-resistance of a semiconductor device.

DETAILED DESCRIPTION

Figure 1A:
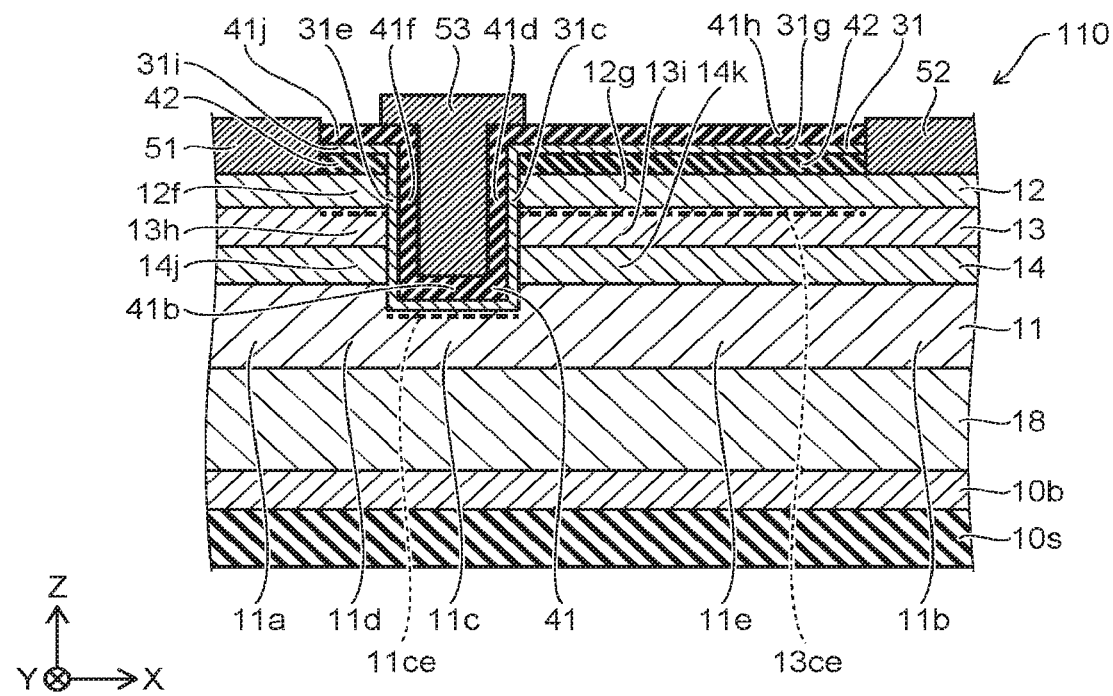
FIG. 1A and FIG. 1B are schematic cross-sectional views illustrating a semiconductor device according to a first embodiment.

According to one embodiment, a semiconductor device includes first to third electrodes, first to fourth semiconductor regions, a first layer including, and a first insulating layer. A position of the third electrode in a first direction is between a position of the first electrode in the first direction and a position of the second electrode in the first direction. The first direction is from the first electrode toward the second electrode. The first semiconductor region includes $Al_{x1}Ga_{1-x1}N$ ($0 \leq x1 < 1$) and includes first to fifth partial regions. A direction from the first partial region toward the first electrode, a direction from the second partial region toward the second electrode, and a direction from the third partial region toward the third electrode are aligned with a second direction crossing the first direction. The fourth partial region is between the first partial region and the third partial region in the first direction. The fifth partial region is between the third partial region and the second partial region in the first direction. The third partial region includes a first element including at least one selected from the group consisting of Mg, Zn, and C. The second semiconductor region includes $Al_{x2}Ga_{1-x2}N$ ($0 < x2 \leq 1$ and $x1 < x2$) and includes a sixth partial region and a seventh partial region. A direction from the fourth partial region toward the sixth partial region and a direction from the fifth partial region toward the seventh partial region are aligned with the second direction. A direction from the third electrode toward the second semiconductor region is aligned with the first direction. The third semiconductor region includes $Al_{x3}Ga_{1-x3}N$ ($0 \leq x3 < 1$ and $x3 < x2$) and includes an eighth partial region and a ninth partial region. The eighth partial region is between the fourth partial region and the sixth partial region in the second direction. The ninth partial region is between the fifth partial region and the seventh partial region in the second direction. A direction from the third electrode toward the third semiconductor region is aligned with the first direction. The fourth semiconductor region includes $Al_{x4}Ga_{1-x4}N$ ($0 < x4 \leq 1$, $x1 < x4$, and $x3 < x4$) and includes a tenth partial region and an eleventh partial region. The tenth partial region is between the fourth partial region and the eighth partial region in the second direction. The eleventh partial region is between the fifth partial region and the ninth partial region in the second direction. A direction from the third electrode toward the fourth semiconductor region is aligned with the first direction. The first layer includes $Al_yGa_{1-y}N$ ($0 < y \leq 1$) and includes a first portion provided between the third partial region and the third electrode in the second direction. The first insulating layer includes a second portion provided between the first portion and the third electrode in the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
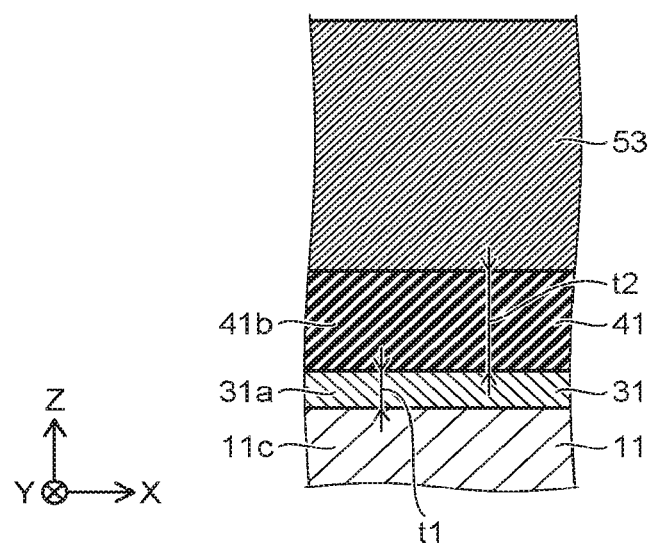

FIG. 1A and FIG. 1B are schematic cross-sectional views illustrating a semiconductor device according to a first embodiment.

FIG. 1B is a schematic view of an enlargement of a portion of FIG. 1A.

As shown in FIG. 1A, the semiconductor device 110 according to the embodiment includes a first electrode 51, a second electrode 52, a third electrode 53, a first semiconductor region 11, a second semiconductor region 12, a third semiconductor region 13, a fourth semiconductor region 14, a first layer 31, and a first insulating layer 41.

The direction from the first electrode 51 toward the second electrode 52 is taken as a first direction.

The first direction is taken as an X-axis direction. One direction perpendicular to the X-axis direction is taken as a Z-axis direction. A direction perpendicular to the X-axis direction and the Z-axis direction is taken as a Y-axis direction.

The position of the third electrode 53 in the first direction (the X-axis direction) is between the position of the first electrode 51 in the first direction and the position of the second electrode 52 in the first direction. For example, in one example, at least a portion of the third electrode 53 is between the first electrode 51 and the second electrode 52 in the first direction. For example, these electrodes may extend along the Y-axis direction.

The first semiconductor region 11 includes $Al_{x1}Ga_{1-x1}N$ ($0 \leq x1 < 1$). The first semiconductor region 11 is, for example, a GaN layer. The first semiconductor region 11 may be, for example, an AlGaN layer. In such a case, the composition ratio (x1) of Al is, for example, less than 0.1.

The first semiconductor region 11 includes first to fifth partial regions 11a to 11e. The direction from the first partial region 11a toward the first electrode 51 is aligned with a second direction. The second direction crosses the first direction (the X-axis direction). The second direction is, for example, the Z-axis direction.

The direction from the second partial region 11b toward the second electrode 52 is aligned with the second direction (e.g., the Z-axis direction). The direction from the third partial region 11c toward the third electrode 53 is aligned with the second direction (e.g., the Z-axis direction). The fourth partial region 11d is between the first partial region 11a and the third partial region 11c in the first direction (the X-axis direction). The fifth partial region 11e is between the third partial region 11c and the second partial region 11b in the first direction (the X-axis direction).

The third partial region 11c includes a first element. The first element includes at least one selected from the group consisting of Mg, Zn, and C. For example, the third partial region 11c is of a p-type. The third partial region 11c is a p-type GaN layer.

The entire first semiconductor region 11 may include the first element. For example, the first semiconductor region 11 is of the p-type. The first semiconductor region 11 is a p-type GaN layer.

The second semiconductor region 12 includes $Al_{x2}Ga_{1-x2}N$ ($0 < x2 \leq 1$ and $x1 < x2$). The second semiconductor region 12 is, for example, AlGaN. The composition ratio (x2) of Al of the second semiconductor region 12 is, for example, not less than 0.1 and not more than 0.4.

The second semiconductor region 12 includes a sixth partial region 12f and a seventh partial region 12g. The direction from the fourth partial region 11d toward the sixth partial region 12f is aligned with the second direction (e.g., the Z-axis direction). The direction from the fifth partial region 11e toward the seventh partial region 12g is aligned with the second direction (e.g., the Z-axis direction). The direction from the third electrode 53 toward the second semiconductor region 12 is aligned with the first direction (the X-axis direction).

The third semiconductor region 13 includes $Al_{x3}Ga_{1-x3}N$ ($0 \leq x3 < 1$ and $x3 < x2$). The third semiconductor region 13 is, for example, a GaN layer. The third semiconductor region 13 may be, for example, an AlGaN layer. In such a case, the composition ratio (x3) of Al is, for example, less than 0.1.

The third semiconductor region 13 includes an eighth partial region 13h and a ninth partial region 13i. The eighth partial region 13h is between the fourth partial region 11d and the sixth partial region 12f in the second direction (e.g., the Z-axis direction). The ninth partial region 13i is between the fifth partial region 11e and the seventh partial region 12g in the second direction (e.g., the Z-axis direction). The direction from the third electrode 53 toward the third semiconductor region 13 is aligned with the first direction (e.g., the X-axis direction).

The fourth semiconductor region 14 includes $Al_{x4}Ga_{1-x4}N$ ($0 < x4 \leq 1$, $x1 < x4$, and $x3 < x4$). The fourth semiconductor region 14 is, for example, AlGaN. The composition ratio (x4) of Al of the fourth semiconductor region 14 is, for example, not less than 0.1 and not more than 0.5.

The fourth semiconductor region 14 includes a tenth partial region 14j and an eleventh partial region 14k. The tenth partial region 14j is between the fourth partial region 11d and the eighth partial region 13h in the second direction (e.g., the Z-axis direction). The eleventh partial region 14k is between the fifth partial region 11e and the ninth partial region 13i in the second direction (e.g., the Z-axis direction). The direction from the third electrode 53 toward the fourth semiconductor region 14 is aligned with the first direction (the X-axis direction).

The first layer 31 includes $Al_{y}Ga_{1-y}N$ ($0 < y \leq 1$). The first layer 31 may be, for example, an AlN layer or an AlGaN layer. The composition ratio (y) of Al of the first layer 31 is, for example, not less than 0.1 and not more than 1.

The first layer 31 includes a first portion 31a. The first portion 31a is provided between the third partial region 11c and the third electrode 53 in the second direction (e.g., the Z-axis direction).

The first insulating layer 41 includes a second portion 41b. The second portion 41b is provided between the first portion 31a and the third electrode 53 in the second direction (e.g., the Z-axis direction). The first insulating layer 41 includes, for example, at least one selected from the group consisting of silicon oxide, silicon oxynitride, and aluminum oxide.

For example, the third semiconductor region 13 includes a region opposing the second semiconductor region 12. For example, a two-dimensional electron gas 13ce (referring to FIG. 1A) is formed in this region. The current that flows between the first electrode 51 and the second electrode 52 can be controlled according to the potential of the third electrode 53.

The third electrode 53 is, for example, a gate electrode. The first electrode 51 is, for example, a source electrode. The second electrode 52 is, for example, a drain electrode. For example, the second portion 41b functions as a gate insulating film. The semiconductor device 110 is, for example, a HEMT (High Electron Mobility Transistor).

In the embodiment, the third electrode 53 is a trench-type. The threshold voltage can be high thereby. For example, a normally-off characteristic is obtained.

In the embodiment, the third partial region 11c of the first semiconductor region 11 is, for example, a GaN layer; and the first portion 31a of the first layer 31 on the third partial region 11c is, for example, an AlN layer or an AlGaN layer. For example, a two-dimensional electron gas 1ice may be formed in a portion corresponding to the first portion 31a of the third partial region 11c due to the difference between the materials of these layers.

In the embodiment, the third partial region 11c includes the first element which is a p-type impurity. When the voltage applied to the third electrode 53 is low, at least a portion of the carriers of the two-dimensional electron gas 11ce are canceled due to the effect of the p-type impurity. Therefore, when the voltage applied to the third electrode 53 is low, a current does not flow easily between the first electrode 51 and the second electrode 52. For example, a high threshold voltage is obtained.

On the other hand, when the voltage applied to the third electrode 53 is high, the effect of the p-type impurity decreases; for example, the current due to the carriers increases due to the two-dimensional electron gas 11ce. The mobility of the carriers is high due to the two-dimensional electron gas 11ce. The on-resistance can be reduced due to the high mobility.

In the embodiment, a high mobility is obtained. For example, the mobility can be improved while obtaining a normally-off characteristic having a high threshold voltage. According to the embodiment, a semiconductor device can be provided in which the on-resistance can be reduced.

As shown in FIG. 1A, the semiconductor device 110 in the embodiment may include, for example, a base body 10s. The base body 10s may be, for example, a silicon substrate.

A buffer layer 10b is provided on the base body 10s. The buffer layer 10b may include, for example, an AlN layer. The buffer layer 10b may include, for example, an AlGaN layer and a GaN layer. Multiple AlGaN layers and multiple GaN layers may be arranged alternately in the Z-axis direction.

A GaN layer 18 may be further provided. The impurity concentration in the GaN layer 18 is lower than the impurity concentration (e.g., the concentration of the first element) in the first semiconductor region 11.

For example, a stacked body that includes the buffer layer 10b, the GaN layer 18, the first semiconductor region 11, the fourth semiconductor region 14, the third semiconductor region 13, and the second semiconductor region 12 in this order is provided on the base body 10s. For example, a trench is formed in the stacked body; and the first layer 31 and the first insulating layer 41 are formed inside the trench. The third electrode 53 is formed by filling the remaining space with a conductive material. In one example, the first electrode 51 is formed to be electrically connected to the sixth partial region 12f. The second electrode 52 is formed to be electrically connected to the seventh partial region 12g.

In the embodiment, at least a portion of the first portion 31a of the first layer 31 may be provided between the fourth partial region 11d and the fifth partial region 11e in the first direction (the X-axis direction). A high threshold is obtained stably.

In the semiconductor device 110, the fourth semiconductor region 14 is provided between the first semiconductor region 11 and the third semiconductor region 13. For example, the first element that is included in the first semiconductor region 11 does not pass through the fourth semiconductor region 14 easily. For example, the movement of the first element from the first semiconductor region 11 toward the third semiconductor region 13 due to heat, etc., is suppressed.

For example, the concentration of the first element in the third semiconductor region 13 is lower than the concentration of the first element in the first semiconductor region 11. For example, the concentration of the first element in the ninth partial region 13i is lower than the concentration of the first element in the fifth partial region 11e.

If the third semiconductor region 13 (the ninth partial region 13i, etc.) includes a high concentration of the first element, there are cases where the mobility in the third semiconductor region 13 (the ninth partial region 13i, etc.) becomes low. For example, a high mobility based on the two-dimensional electron gas 13ce is obtained in the third semiconductor region 13 (the ninth partial region 13i, etc.).

A high mobility in the third semiconductor region 13 (the ninth partial region 13i, etc.) can be maintained because the concentration of the first element in the third semiconductor region 13 (the ninth partial region 13i, etc.) is lower than the concentration of the first element in the first semiconductor region 11 (the fifth partial region 11e, etc.).

In the embodiment, for example, the first portion 31a of the first layer 31 includes a crystalline portion. Thereby, a high mobility is obtained in the portion of the third partial region 11c opposing the first portion 31a.

As shown in FIG. 1A, the first layer 31 may include a third portion 31c. In the first direction (the X-axis direction), the third portion 31c is provided between the third electrode 53 and the seventh partial region 12g, between the third electrode 53 and the ninth partial region 13i, and between the third electrode 53 and the eleventh partial region 14k. The third portion 31c is a portion provided at the side surface of the trench.

The first insulating layer 41 may include a fourth portion 41d. The fourth portion 41d is provided between the third electrode 53 and the third portion 31c in the first direction (the X-axis direction). The fourth portion 41d is a portion provided at the side surface of the trench.

The third portion 31c of the first layer 31 may include a crystalline portion. For example, a crystalline portion may be formed as the first layer 31 at the side surface of the trench due to effects of the second to fourth semiconductor regions 12 to 14. For example, by forming a crystal at the side surface of the trench, for example, the connection between the two-dimensional electron gas 11ce and the two-dimensional electron gas 13ce is improved. For example, the on-resistance can be reduced.

As shown in FIG. 1A, the first layer 31 may include a fifth portion 31e. In the first direction (the X-axis direction), the fifth portion 31e is provided between the third electrode 53 and the sixth partial region 12f, between the third electrode 53 and the eighth partial region 13h, and between the third electrode 53 and the tenth partial region 14j. The fifth portion 31e of the first layer 31 may include a crystalline portion.

The first insulating layer 41 may include a sixth portion 41f. The sixth portion 41f is provided between the third electrode 53 and the fifth portion 31e in the first direction (the X-axis direction).

As shown in FIG. 1A, the first layer 31 may include a seventh portion 31g. The seventh partial region 12g of the second semiconductor region 12 is provided between the ninth partial region 13i and the seventh portion 31g in the second direction (e.g., the Z-axis direction).

The first insulating layer 41 may include an eighth portion 41h. The seventh portion 31g is provided between the seventh partial region 12g and the eighth portion 41h in the second direction (the Z-axis direction).

As shown in FIG. 1A, the first layer 31 may include a ninth portion 31i. The sixth partial region 12f of the second semiconductor region 12 is provided between the eighth partial region 13h and the ninth portion 31i in the second direction (e.g., the Z-axis direction).

The first insulating layer 41 may include a tenth portion 41j. The ninth portion 31i is provided between the sixth partial region 12f and the tenth portion 41j in the second direction (the Z-axis direction).

As shown in FIG. 1A, the semiconductor device 110 may further include a second insulating layer 42. At least a portion of the second insulating layer 42 is provided between the seventh partial region 12g and the seventh portion 31g in the second direction (the Z-axis direction). Another portion of the second insulating layer 42 may be provided between the sixth partial region 12f and the ninth portion 31i in the second direction (the Z-axis direction). For example, the seventh portion 31g is provided between the second insulating layer 42 and the eighth portion 41h in the Z-axis direction. For example, the ninth portion 31i is provided between the second insulating layer 42 and the tenth portion 41j in the Z-axis direction.

The second insulating layer 42 includes, for example, silicon and nitrogen. The second insulating layer 42 includes, for example, silicon nitride. For example, the second insulating layer 42 protects the upper surface of the second semiconductor region 12, etc. For example, the second insulating layer 42 functions as a passivation film.

A portion (the seventh portion 31g, the ninth portion 31i, etc.) of the first layer 31 is provided on the second insulating layer 42. The seventh portion 31g and the ninth portion 31i may be, for example, amorphous. For example, the crystallinity of the first portion 31a is higher than the crystallinity of at least one of the seventh portion 31g or the ninth portion 31i. For example, the crystallinity of the third portion 31c is higher than the crystallinity of at least one of the seventh portion 31g or the ninth portion 31i. For example, the crystallinity of the fifth portion 31e is higher than the crystallinity of at least one of the seventh portion 31g or the ninth portion 31i.

The length (the thickness) along the Z-axis direction of the first semiconductor region 11 is, for example, not less than 0.5 μm and not more than 2 μm. The length (the thickness) along the Z-axis direction of the fourth semiconductor region 14 is, for example, not less than 2 nm and not more than 10 nm. The length (the thickness) along the Z-axis direction of the third semiconductor region 13 is, for example, not less than 2 nm and not more than 10 nm. The length (the thickness) along the Z-axis direction of the second semiconductor region 12 is, for example, not less than 10 nm and not more than 50 nm.

As described above, in one example of a method for manufacturing the semiconductor device 110, a trench is formed in a stacked body including the multiple semiconductor regions recited above. The bottom portion of the trench reaches the first semiconductor region 11. For example, the tolerance when forming the trench is wider because the first semiconductor region 11 is thick. A semiconductor device that has a high threshold voltage and a high mobility can be manufactured stably. A semiconductor device can be provided in which the characteristics are uniform even when the manufacturing conditions fluctuate.

As shown in FIG. 1B, the length along the second direction (e.g., the Z-axis direction) of the second portion 41b of the first insulating layer 41 is taken as a thickness t2. The thickness t2 is, for example, not less than 10 nm and not more than 60 nm. For example, a high gate breakdown voltage is obtained thereby. Stable threshold characteristics are obtained.

As shown in FIG. 1B, the length along the second direction (e.g., the Z-axis direction) of the first portion 31a of the first layer 31 is taken as a thickness t1. The thickness t1 is, for example, not less than 0.5 nm and not more than 5 nm. For example, the desired threshold voltage may be obtained by controlling the thickness t1 of the first portion 31a.

The desired threshold voltage may be obtained by controlling the concentration of the first element (e.g., the p-type impurity) in the third partial region 11c of the first semiconductor region 11.

An example of the characteristics of the semiconductor device will now be described. An example of the gate voltage dependence of the electrical capacitance of the stacked body will be described. The gate voltage corresponds to the potential of the third electrode 53 when referenced to the potential of the first electrode 51.

Figure 2A:
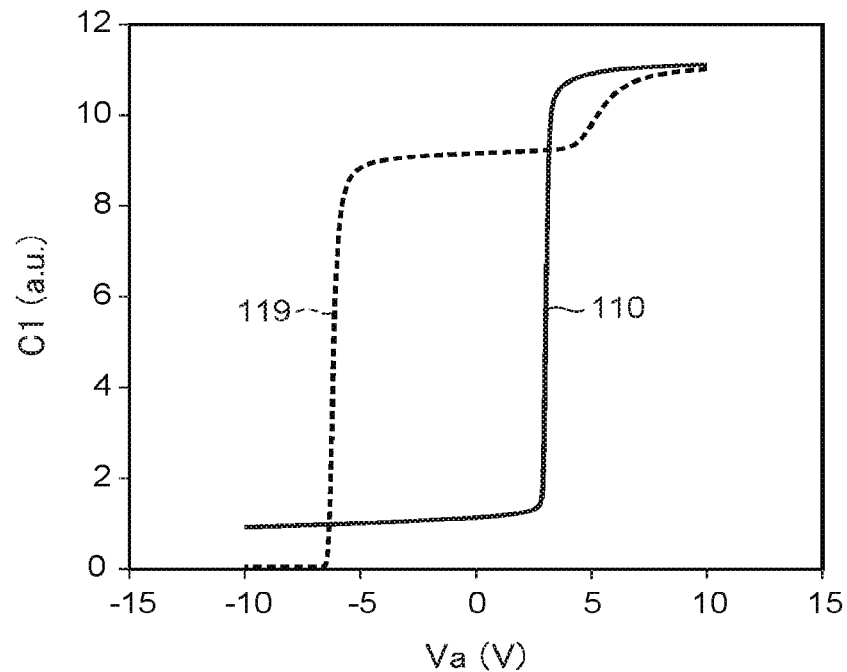
FIG. 2A and FIG. 2B are graphs illustrating characteristics of semiconductor devices.
Figure 2B:
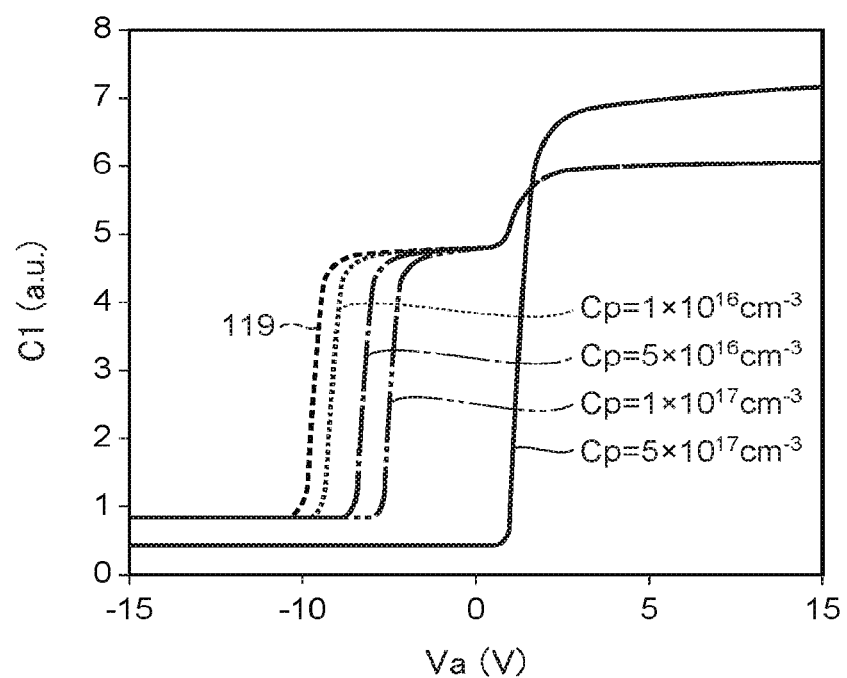

FIG. 2A and FIG. 2B are graphs illustrating characteristics of semiconductor devices.

In these drawings, the horizontal axis is an applied voltage Va (V). The applied voltage Va corresponds to the gate voltage. The vertical axis is an electrical capacitance (arbitrary units).

FIG. 2A shows experimental data relating to semiconductor devices. FIG. 2A shows a characteristic of the semiconductor device 110 recited above and a characteristic of a semiconductor device 119 of a reference example. In the semiconductor device 110, the first semiconductor region 11 includes Mg as the first element. In the semiconductor device 119, the first semiconductor region 11 does not include Mg. Otherwise, the configurations of these semiconductor devices are the same. In the example, the first layer 31 is an AlN layer in these semiconductor devices. The thickness (the thickness t1) of the first layer 31 is 3 nm.

As shown in FIG. 2A, the threshold voltage is negative in the semiconductor device 119 in which the first semiconductor region 11 does not include Mg. The threshold voltage is positive in the semiconductor device 110 in which the first semiconductor region 11 includes Mg. A normally-off characteristic is obtained in the semiconductor device 110.

FIG. 2B shows simulation results relating to the semiconductor devices. FIG. 2B shows the characteristics of the semiconductor device 110 when changing the concentration of the first element (Mg) in the first semiconductor region 11 to be $1 \times 10^{16}$ cm$^{-3}$, $5 \times 10^{16}$ cm$^{-3}$, $1 \times 10^{17}$ cm$^{-3}$, and $5 \times 10^{17}$ cm$^{-3}$. FIG. 2B also shows the characteristic of the semiconductor device 119 of the reference example recited above.

It can be seen from FIG. 2B that the threshold voltage increases as the concentration of the first element (Mg) in the first semiconductor region 11 increases.

In the embodiment, the threshold voltage may be controlled by at least one of the concentration of the first element (e.g., the p-type impurity) in the third partial region 11c or the length (the thickness t1) along the second direction (e.g., the Z-axis direction) of the first portion 31a of the first layer 31.

In one example, the concentration of the first element in the third partial region 11c is not less than $1 \times 10^{15}$ cm$^{-3}$ and not more than $1 \times 10^{18}$ cm$^{-3}$. In one example, the thickness t1 of the first portion 31a is, for example, not less than 0.5 nm and not more than 5 nm.

Several examples of the semiconductor device according to the embodiment will now be described. A description is omitted for portions similar to those of the semiconductor device 110 (referring to FIG. 1A).

Figure 3:
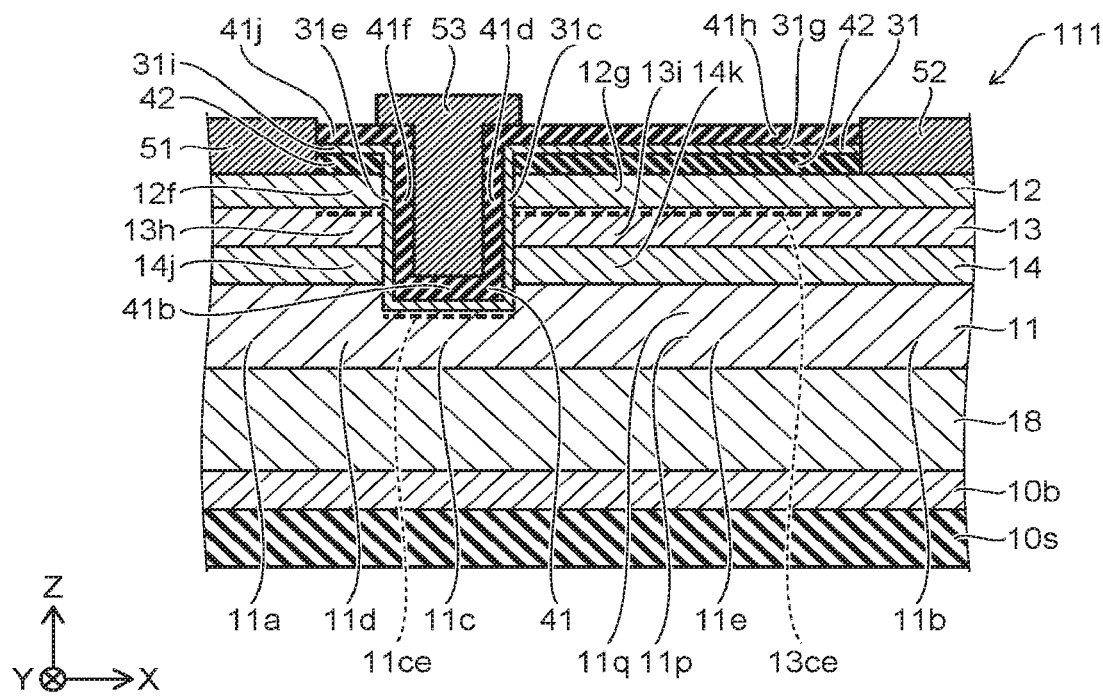
FIG. 3 is a schematic cross-sectional view illustrating a semiconductor device according to the first embodiment.

FIG. 3 is a schematic cross-sectional view illustrating a semiconductor device according to the first embodiment.

In the semiconductor device 111 as shown in FIG. 3, the fifth partial region 11e includes a first region 11p and a second region 11q. The second region 11q is provided between the first region 11p and the eleventh partial region 14k in the second direction (e.g., the Z-axis direction). The concentration of the first element in the second region 11q may be different from the concentration of the first element in the first region 11p. The concentration of the first element in the second region 11q may be lower than the concentration of the first element in the first region 11p. For example, the movement of the first element into the third semiconductor region 13 is suppressed further. A higher mobility is obtained.

The first region 11p recited above and the second region 11q recited above may be provided in the fourth partial region 11d.

Figure 4:
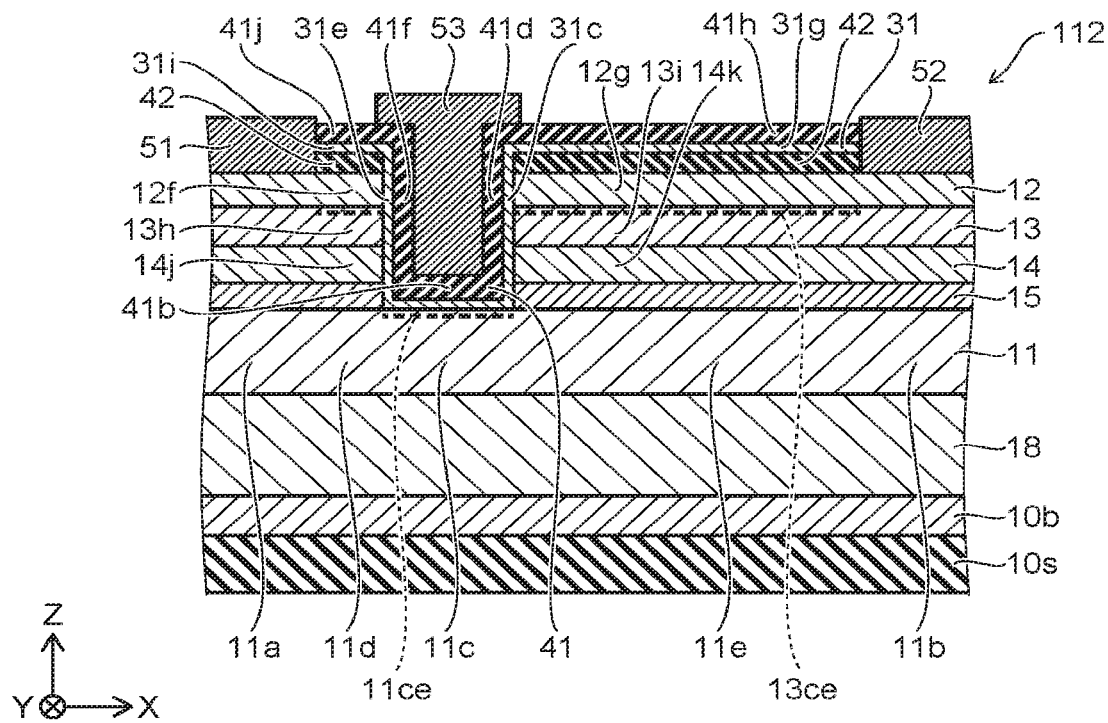
FIG. 4 is a schematic cross-sectional view illustrating a semiconductor device according to the first embodiment.

FIG. 4 is a schematic cross-sectional view illustrating a semiconductor device according to the first embodiment.

As shown in FIG. 4, the semiconductor device 112 further includes a fifth semiconductor region 15. The fifth semiconductor region 15 includes $Al_{x5}Ga_{1-x5}N$ ($0 \leq x5 < 1$, $x5 < x2$, $x5 < x4$, and $x5 < y$). The fifth semiconductor region 15 may be, for example, a GaN layer.

The fifth semiconductor region 15 is provided between the fourth partial region 11d and the tenth partial region 14j in the second direction (e.g., the Z-axis direction) and between the fifth partial region 11e and the eleventh partial region 14k in the second direction (e.g., the Z-axis direction).

For example, the concentration of the first element in the fifth semiconductor region 15 is lower than the concentration of the first element in the fourth partial region 11d. For example, the concentration of the first element in the fifth semiconductor region 15 is lower than the concentration of the first element in the fifth partial region 11e. The fifth semiconductor region 15 is, for example, an i-GaN layer.

By providing the fifth semiconductor region 15 having the low concentration of the first element between the first semiconductor region 11 and the fourth semiconductor region 14, for example, the movement toward the third semiconductor region 13 of the first element included in the first semiconductor region 11 is suppressed further. For example, a high mobility is easily obtained stably.

A portion of the fifth semiconductor region 15 may be provided between the first semiconductor region 11 (the third partial region 11c) and the first layer 31 (the first portion 31a) in the Z-axis direction. For example, a higher mobility is obtained.

Figure 5:
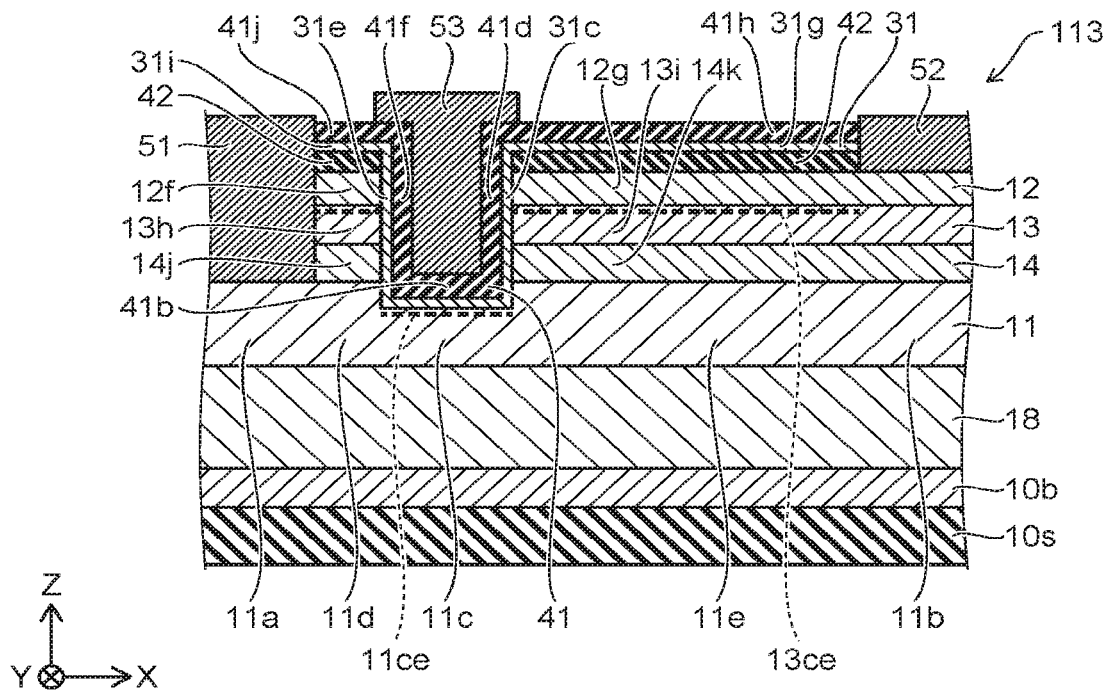
FIG. 5 is a schematic cross-sectional view illustrating a semiconductor device according to the first embodiment.

FIG. 5 is a schematic cross-sectional view illustrating a semiconductor device according to the first embodiment.

In the semiconductor device 113 as shown in FIG. 5, the first electrode 51 contacts the first partial region 11a.

For example, the sixth partial region 12f is between the first electrode 51 and the third electrode 53 in the first direction (the X-axis direction). For example, the eighth partial region 13h is between the first electrode 51 and the third electrode 53 in the first direction. The tenth partial region 14j is between the first electrode 51 and the third electrode 53 in the first direction.

For example, the first electrode 51 is electrically connected to the first partial region 11a of the first semiconductor region 11. For example, the potential of the first semiconductor region 11 is stable. For example, the first semiconductor region 11 is set to the ground potential. For example, stable characteristics are obtained easily.

Figure 6:
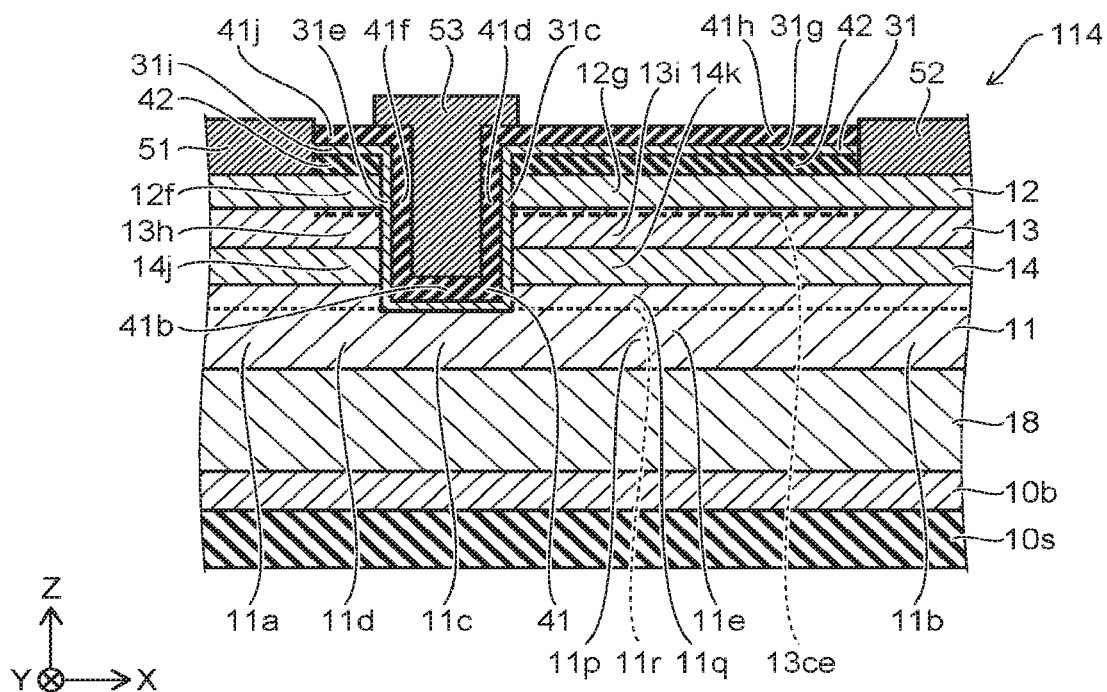
FIG. 6 is a schematic cross-sectional view illustrating a semiconductor device according to the first embodiment.

FIG. 6 is a schematic cross-sectional view illustrating a semiconductor device according to the first embodiment.

In the semiconductor device 114 as shown in FIG. 6, the fifth partial region 11e includes the first region 11p, the second region 11q, and a third region 11r. The second region 11q is provided between the first region 11p and the eleventh partial region 14k in the second direction (e.g., the Z-axis direction). The third region 11r is provided between the first region 11p and the second region 11q in the second direction (e.g., the Z-axis direction). The third region 11r includes Si (silicon). The thickness along the Z-axis direction of the third region 11r is, for example, not less than 0.5 nm and not more than 20 nm.

In the semiconductor device 114, the third region 11r that includes Si is provided locally in a thickness-direction portion of the first semiconductor region 11.

For example, by providing the first element (a p-type impurity) and silicon (an n-type impurity), at least a portion of these impurities cancels. Thereby, for example, the breakdown voltage increases.

As described below, the portion of the first semiconductor region 11 including the first region 11p may be epitaxially grown; subsequently, the surface of the portion may be caused to contact an atmosphere including silicon; subsequently, the remaining portion (the second region 11q, etc.) of the first semiconductor region 11 may be grown. In this method, the third region 11r recited above may be formed by causing the surface to contact an atmosphere including silicon. For example, according to such a method, high crystallinity is obtained easily in the second region 11q and in the semiconductor regions formed on the second region 11q.

Figure 7:
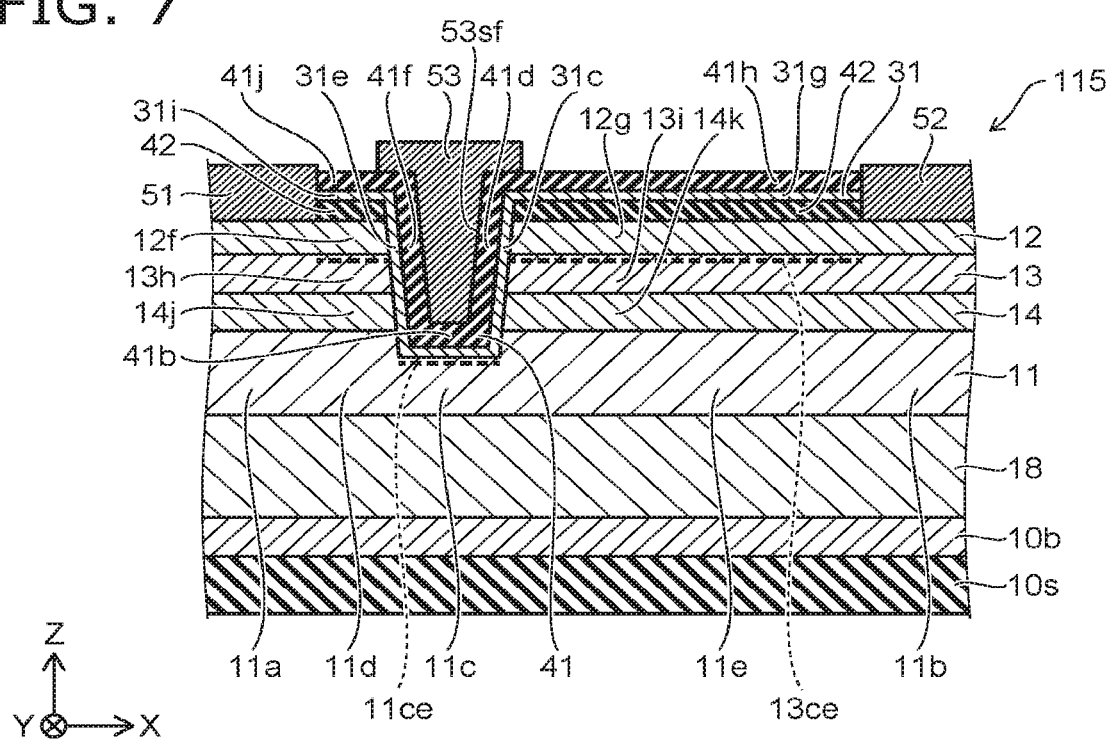
FIG. 7 is a schematic cross-sectional view illustrating a semiconductor device according to the first embodiment.

FIG. 7 is a schematic cross-sectional view illustrating a semiconductor device according to the first embodiment.

In the semiconductor device 115 as shown in FIG. 7, the side surface of the trench of the third electrode 53 is oblique to the Z-axis direction.

For example, the third electrode 53 has a surface 53sf opposing the second semiconductor region 12. The surface 53sf is, for example, the side surface. The surface 53sf is oblique to the first direction (the X-axis direction). For example, the surface 53sf may be oblique to the second direction (e.g., the Z-axis direction).

Such an oblique surface 53sf may be provided in the semiconductor devices 111 to 114. For example, the connection between the two-dimensional electron gas 11ce and the two-dimensional electron gas 13ce can be improved; and the on-resistance can be reduced. For example, the electric field concentration at the gate electrode end portion is suppressed. A high breakdown voltage is obtained.

Second Embodiment

A second embodiment relates to a method for manufacturing a semiconductor device.

Figure 8A:
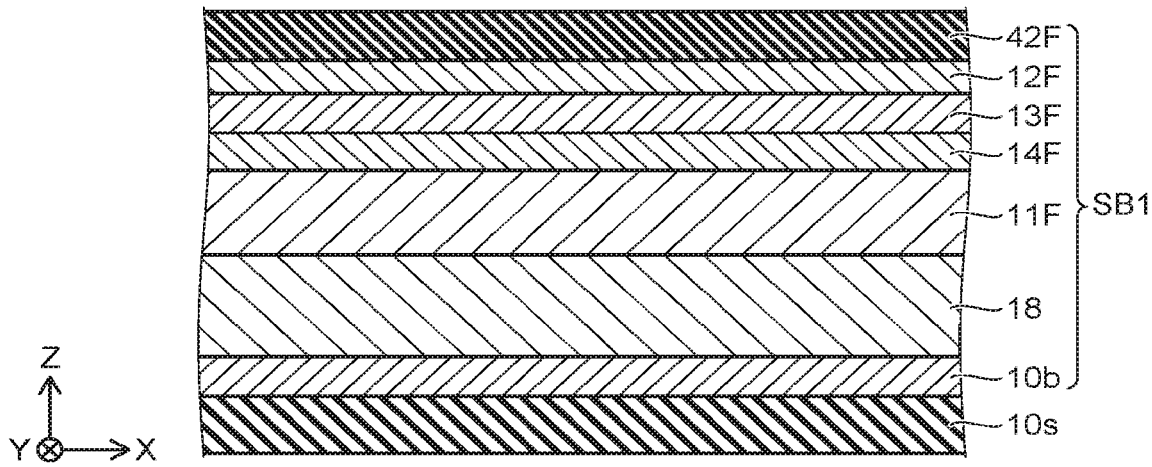
FIG. 8A to FIG. 8C are schematic cross-sectional views illustrating a method for manufacturing a semiconductor device according to a second embodiment.
Figure 8B:
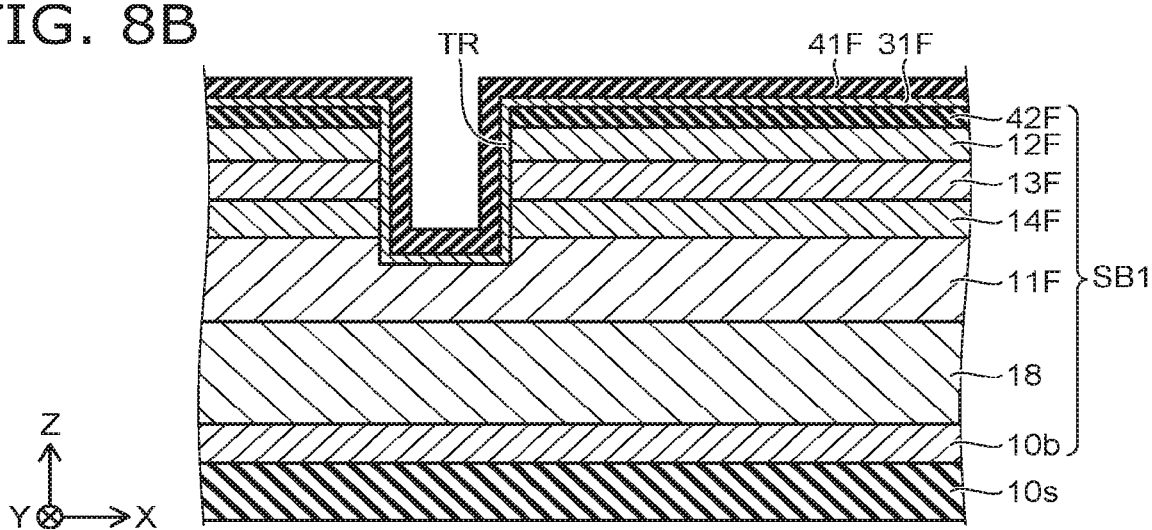
Figure 8C:
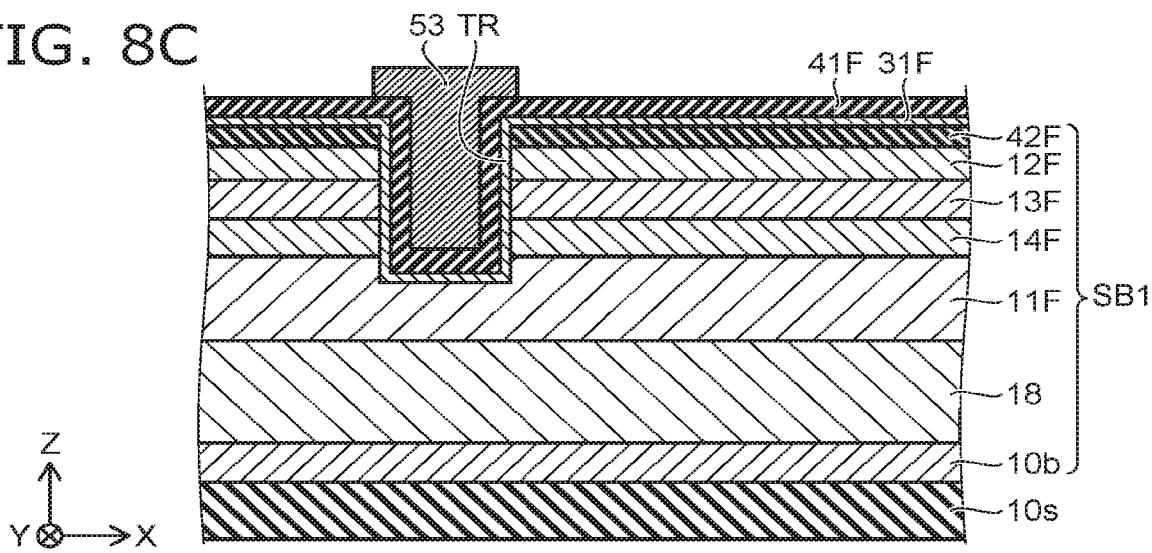

FIG. 8A to FIG. 8C are schematic cross-sectional views illustrating the method for manufacturing the semiconductor device according to the second embodiment.

A stacked body SB1 is prepared as shown in FIG. 8A. The stacked body SB1 includes first to fourth semiconductor films 11F to 14F. The third semiconductor film 13F is provided between the first semiconductor film 11F and the second semiconductor film 12F. The fourth semiconductor film 14F is provided between the first semiconductor film 11F and the third semiconductor film 13F.

The first semiconductor film 11F is used to form at least a portion of the first semiconductor region 11 recited above. The fourth semiconductor film 14F is used to form at least a portion of the fourth semiconductor region 14 recited above. The third semiconductor film 13F is used to form at least a portion of the third semiconductor region 13 recited above. The second semiconductor film 12F is used to form at least a portion of the second semiconductor region 12 recited above.

For example, the buffer layer 10b and the GaN layer 18 are formed on the base body 10s; and the stacked body SB1 is formed on the GaN layer 18. The formation includes, for example, epitaxial growth. The buffer layer 10b and the GaN layer 18 may be included in the stacked body SB1.

As shown in FIG. 8A, a passivation film 42F is formed on the second semiconductor film 12F. The passivation film 42F includes, for example, silicon nitride.

As shown in FIG. 8B, a trench TR is formed by removing a portion of the passivation film 42F and a portion of the stacked body SB1. The bottom surface of the trench TR reaches the first semiconductor film 11F.

As shown in FIG. 8B, on the bottom surface and the side surface of the trench TR, a first film 31F is formed; and a first insulating film 41F is formed. The first film 31F is used to form at least a portion of the first layer 31. The first insulating film 41F is used to form at least a portion of the first insulating layer 41.

As shown in FIG. 8C, the third electrode 53 is formed by filling a conductive material into the remaining space of the trench TR. The first electrode 51 and the second electrode 52 are formed as appropriate. Thereby, for example, the semiconductor device 110 or the like is obtained.

Figure 9A:
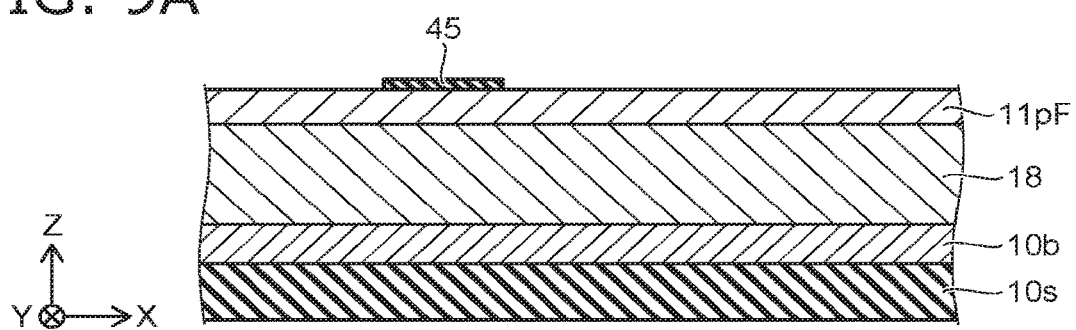
FIG. 9A and FIG. 9B are schematic cross-sectional views illustrating a method for manufacturing the semiconductor device according to the second embodiment.
Figure 9B:
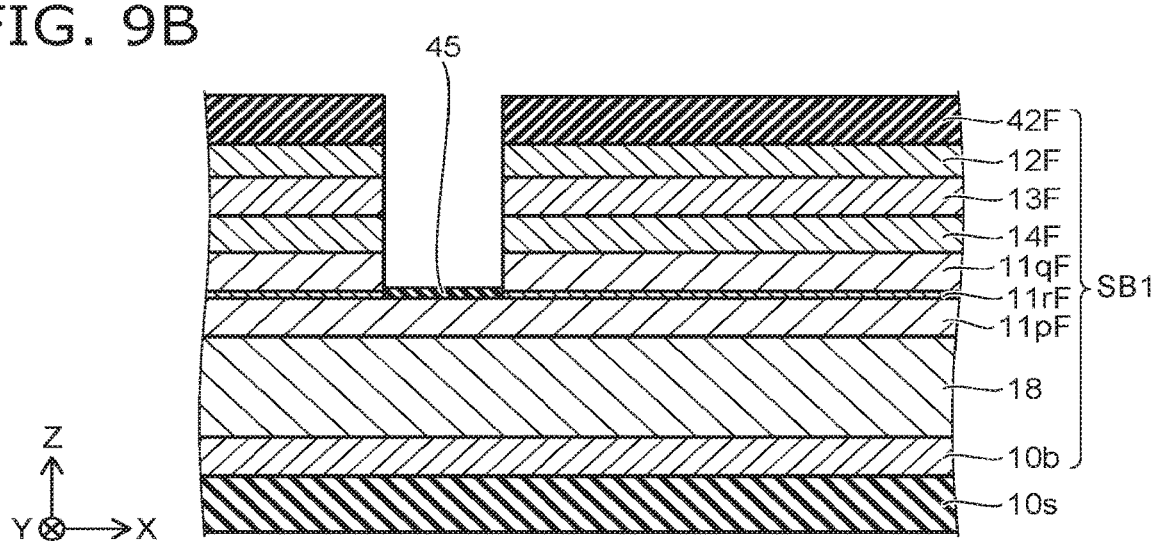

FIG. 9A and FIG. 9B are schematic cross-sectional views illustrating a method for manufacturing the semiconductor device according to the second embodiment.

As shown in FIG. 9A, a semiconductor film 11pF that is used to form the first region 11p of the first semiconductor region 11 is prepared. In the example, the buffer layer 10b and the GaN layer 18 are formed on the base body 10s; and the semiconductor film 11pF is formed on the GaN layer 18. A mask film 45 is formed on a portion of the surface of the semiconductor film 11pF. The mask film 45 includes, for example, at least one selected from the group consisting of silicon oxide and silicon nitride.

Subsequently, the surface of the semiconductor film 11pF is caused to contact an atmosphere (which may be, for example, air) including Si. Si adheres to the surface of the semiconductor film 11pF thereby.

Subsequently, the fourth semiconductor film 14F, the third semiconductor film 13F, and the second semiconductor film 12F are sequentially formed on the surface of the semiconductor film 11pF. For example, epitaxial growth is performed.

At this time, as shown in FIG. 9B, these semiconductor films are not formed on the mask film 45.

Subsequently, the passivation film 42F is formed; and the mask film 45 is removed. Then, as described in reference to FIG. 8B and FIG. 8C, the first film 31F and the first insulating film 41F are formed; and the third electrode 53 is formed. The first electrode 51 and the second electrode 52 are formed. Thereby, for example, the semiconductor device 114 or the like is obtained.

According to the embodiments, a semiconductor device can be provided in which the on-resistance can be reduced.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, electrodes, insulating layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode;
a third electrode, a position of the third electrode in a first direction being between a position of the first electrode in the first direction and a position of the second electrode in the first direction, the first direction being from the first electrode toward the second electrode;
a first semiconductor region including $Al_{x1}Ga_{1-x1}N$ ($0 \leq x1 < 1$) and including first to fifth partial regions, a direction from the first partial region toward the first electrode, a direction from the second partial region toward the second electrode, and a direction from the third partial region toward the third electrode being aligned with a second direction crossing the first direction, the fourth partial region being between the first partial region and the third partial region in the first direction, the fifth partial region being between the third partial region and the second partial region in the first direction, the third partial region including a first element including at least one selected from the group consisting of Mg, Zn, and C;
a second semiconductor region including $Al_{x2}Ga_{1-x2}N$ ($0 < x2 \leq 1$ and $x1 < x2$) and including a sixth partial region and a seventh partial region, a direction from the fourth partial region toward the sixth partial region and a direction from the fifth partial region toward the seventh partial region being aligned with the second direction, a direction from the third electrode toward the second semiconductor region being aligned with the first direction;
a third semiconductor region including $Al_{x3}Ga_{1-x3}N$ ($0 \leq x3 < 1$ and $x3 < x2$) and including an eighth partial region and a ninth partial region, the eighth partial region being between the fourth partial region and the sixth partial region in the second direction, the ninth partial region being between the fifth partial region and the seventh partial region in the second direction, a direction from the third electrode toward the third semiconductor region being aligned with the first direction;

a fourth semiconductor region including $Al_{x4}Ga_{1-x4}N$ ($0<x4\leq1$, $x1<x4$, and $x3<x4$) and including a tenth partial region and an eleventh partial region, the tenth partial region being between the fourth partial region and the eighth partial region in the second direction, the eleventh partial region being between the fifth partial region and the ninth partial region in the second direction, a direction from the third electrode toward the fourth semiconductor region being aligned with the first direction;

a first layer including $Al_yGa_{1-y}N$ ($0<y\leq1$) and including a first portion provided between the third partial region and the third electrode in the second direction; and a first insulating layer including a second portion provided between the first portion and the third electrode in the second direction.

2. The device according to claim 1, wherein at least a portion of the first portion is provided between the fourth partial region and the fifth partial region in the first direction.

3. The device according to claim 1, wherein a concentration of the first element in the third semiconductor region is lower than a concentration of the first element in the first semiconductor region.

4. The device according to claim 1, wherein the first portion includes a crystalline portion.

5. The device according to claim 1, wherein
the first layer includes a third portion, and
in the first direction, the third portion is provided between the third electrode and the seventh partial region, between the third electrode and the ninth partial region, and between the third electrode and the eleventh partial region.

6. The device according to claim 5, wherein
the first insulating layer includes a fourth portion, and
the fourth portion is provided between the third electrode and the third portion in the first direction.

7. The device according to claim 5, wherein the third portion includes a crystalline portion.

8. The device according to claim 1, wherein
the first layer includes a fifth portion, and
in the first direction, the fifth portion is provided between the third electrode and the sixth partial region, between the third electrode and the eighth partial region, and between the third electrode and the tenth partial region.

9. The device according to claim 8, wherein
the first insulating layer includes a sixth portion, and
the sixth portion is provided between the third electrode and the fifth portion in the first direction.

10. The device according to claim 1, wherein
the first layer includes a seventh portion, and
the seventh partial region is provided between the ninth partial region and the seventh portion in the second direction.

11. The device according to claim 10, wherein a crystallinity of the first portion is higher than a crystallinity of the seventh portion.

12. The device according to claim 10, further comprising a second insulating layer,
at least a portion of the second insulating layer being provided between the seventh partial region and the seventh portion in the second direction,
the second insulating layer including silicon and nitrogen.

13. The device according to claim 1, wherein a concentration of the first element in the first semiconductor region is not less than $1\times10^{15}$ cm$^{-3}$ and not more than $1\times10^{18}$ cm$^{-3}$.

14. The device according to claim 1, wherein
the third electrode has a surface opposing the second semiconductor region, and
the surface is oblique to the first direction.

15. The device according to claim 1, wherein a thickness along the second direction of the first portion is not less than 0.5 nm and not more than 5 nm.

16. The device according to claim 1, further comprising a fifth semiconductor region including $Al_{x5}Ga_{1-x5}N$ ($0\leq x5<1$, $x5<x2$, $x5<x4$, and $x5<y$),
the fifth semiconductor region being provided between the fourth partial region and the tenth partial region in the second direction and between the fifth partial region and the eleventh partial region in the second direction.

17. The device according to claim 1, wherein
the fifth partial region includes:
a first region; and
a second region provided between the first region and the eleventh partial region in the second direction, and
a concentration of the first element in the second region is lower than a concentration of the first element in the first region.

18. The device according to claim 1, wherein
the sixth partial region is between the first electrode and the third electrode in the first direction,
the eighth partial region is between the first electrode and the third electrode in the first direction, and
the tenth partial region is between the first electrode and the third electrode in the first direction.

19. The device according to claim 1, wherein the first electrode contacts the first partial region.

20. The device according to claim 1, wherein
the fifth partial region includes:
a first region;
a second region provided between the first region and the eleventh partial region in the second direction; and
a third region including Si and being provided between the first region and the second region in the second direction.

* * * * *